US011015115B2

(12) United States Patent
Qiu et al.

(10) Patent No.: US 11,015,115 B2
(45) Date of Patent: *May 25, 2021

(54) CURABLE QUANTUM DOT COMPOSITIONS AND ARTICLES

(71) Applicant: 3M INNOVATIVE PROPERTIES COMPANY, St. Paul, MN (US)

(72) Inventors: Zai-Ming Qiu, Woodbury, MN (US); Kenton D. Budd, Woodbury, MN (US); Mahmut Aksit, Woodbury, MN (US); Neeraj Sharma, Woodbury, MN (US); Joseph M. Pieper, Atlanta, GA (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 232 days.

This patent is subject to a terminal disclaimer.

(21) Appl. No.: 16/066,604

(22) PCT Filed: Dec. 20, 2016

(86) PCT No.: PCT/US2016/067661
§ 371 (c)(1),
(2) Date: Jun. 27, 2018

(87) PCT Pub. No.: WO2017/116820
PCT Pub. Date: Jul. 6, 2017

(65) Prior Publication Data
US 2019/0016952 A1 Jan. 17, 2019

Related U.S. Application Data

(60) Provisional application No. 62/273,894, filed on Dec. 31, 2015.

(51) Int. Cl.
| C08K 9/02 | (2006.01) |
| C09K 11/02 | (2006.01) |
| C09K 11/88 | (2006.01) |
| C08G 75/045 | (2016.01) |
| H01L 51/50 | (2006.01) |
| G02B 5/20 | (2006.01) |
| C09K 11/56 | (2006.01) |
| C08K 3/30 | (2006.01) |
| B82Y 20/00 | (2011.01) |
| B82Y 40/00 | (2011.01) |

(52) U.S. Cl.
CPC .......... *C09K 11/025* (2013.01); *C08G 75/045* (2013.01); *C08K 3/30* (2013.01); *C08K 9/02* (2013.01); *C09K 11/02* (2013.01); *C09K 11/565* (2013.01); *C09K 11/883* (2013.01); *G02B 5/206* (2013.01); *H01L 51/502* (2013.01); *B82Y 20/00* (2013.01); *B82Y 40/00* (2013.01); *C08K 2003/3036* (2013.01)

(58) Field of Classification Search
CPC ..... C09K 11/025; C09K 11/02; C09K 11/565; C09K 11/70; C09K 11/883; C09K 1/565; C08G 75/045; C08K 3/30; C08K 9/02; C08K 2003/3036; G02B 5/206; H01L 51/502; C08L 29/10; C08L 81/02; B82Y 20/00; B82Y 40/00
USPC .......................................................... 523/210
See application file for complete search history.

(56) References Cited

U.S. PATENT DOCUMENTS

| 3,317,469 A | 5/1967 | Feichtinger |
| 4,808,638 A | 2/1989 | Steinkraus |
| 5,021,512 A | 6/1991 | Woods |
| 5,080,928 A | 1/1992 | Klinedinst |
| 5,156,885 A | 10/1992 | Budd |
| 5,208,281 A | 5/1993 | Glaser |
| 5,358,976 A | 10/1994 | Dowling |
| 5,371,181 A | 12/1994 | Glaser |
| 5,399,624 A | 3/1995 | Glaser |

(Continued)

FOREIGN PATENT DOCUMENTS

| CN | 102690658 | 9/2012 |
| CN | 104310784 | 1/2015 |

(Continued)

OTHER PUBLICATIONS

Ciriminna, "From molecules to systems: sol-gel microencapsulation in silica-based materials", Chem. Rev, 2011, vol. 111, No. 2, pp. 765-789.
Cole, "Redox Initiation of bulk thiol-ene polymerizations", Polym. Chem ,2013, vol. 4, pp. 1167-1175.
Denayer, "Low-coverage adsorption properties of the metal-organic framework MIL-47 studied by pulse chromatography and monte carlo simulations", PCCP, 2009, vol. 11, No. 18, pp. 3515-3521.
Freitas, "Connecting the (quantum) dots: towards hybrid photovoltaic devices based on chalcogenide gels", Phys. Chem. Chem. Phys., 2012, vol. 14, pp. 15180-15184.
Hoyle, "Thiol-Enes: Chemistry of the Past with Promise for the Future", Journal of Polymer Science, 2004, vol. 42, pp. 5301-5338.

(Continued)

*Primary Examiner* — Hannah J Pak
(74) *Attorney, Agent, or Firm* — Lisa P. Fulton

(57) ABSTRACT

Article comprising composite particles in an organic polymer matrix comprising a cured thiol-alkene resin having a $T_g > 20°$ C., the composite particles comprising a hydrophobic nonmetallic inorganic matrix, ligands, and quantum dots, wherein the hydrophobic nonmetallic inorganic matrix is present in the composite particles in an amount of up to 40 volume percent. Exemplary articles described herein can be made for use for display applications such as films, LED caps, LED coatings, LED lenses, and light guides. Exemplary articles described herein can be made for use for non-display applications such as security applications where quantum dot phosphors are used to provide fluorescence at selected or tailored wavelengths. In such uses, the organic polymer matrix could be a label or a coating on a label, or other articles such as a card or tag.

11 Claims, 1 Drawing Sheet

(56) References Cited

U.S. PATENT DOCUMENTS

| | | |
|---|---|---|
| 5,459,173 A | 10/1995 | Glaser |
| 5,593,795 A | 1/1997 | Chen |
| 5,876,210 A | 3/1999 | Klee |
| 5,876,805 A | 3/1999 | Ostlie |
| 5,945,464 A | 8/1999 | Takushima |
| 6,153,719 A | 11/2000 | Abbey |
| 6,369,164 B1 | 4/2002 | Klee |
| 6,468,808 B1 | 10/2002 | Nie |
| 6,506,814 B2 | 1/2003 | Krongauz |
| 6,669,873 B1 | 12/2003 | Smith |
| 7,018,713 B2 | 3/2006 | Padiyath |
| 7,037,729 B2 | 5/2006 | Nie |
| 7,226,953 B1 | 6/2007 | Petruska |
| 7,374,807 B2 | 5/2008 | Parce |
| 7,521,015 B2 | 4/2009 | Cheng |
| 7,645,397 B2 | 1/2010 | Parce |
| 7,648,845 B2 | 1/2010 | Nie |
| 7,927,515 B2 | 4/2011 | Jang |
| 8,192,673 B2 | 6/2012 | Bowman |
| 8,252,416 B2 | 8/2012 | Jun |
| 8,288,649 B2 | 10/2012 | Serban |
| 8,343,575 B2 | 1/2013 | Dubrow |
| 8,425,803 B2 | 4/2013 | Parce |
| 8,440,736 B2 | 5/2013 | Hoyle |
| 8,519,086 B2 | 8/2013 | Bowman |
| 8,592,037 B2 | 11/2013 | Parce |
| 9,139,770 B2 | 9/2015 | Freeman |
| 9,376,603 B2 | 6/2016 | Okazaki |
| 10,023,793 B2 * | 7/2018 | Budd .................. C09K 11/883 |
| 2003/0042845 A1 | 3/2003 | Pires |
| 2006/0019098 A1 | 1/2006 | Chan |
| 2006/0128826 A1 | 6/2006 | Ellison |
| 2007/0043205 A1 | 2/2007 | Dias |
| 2007/0112100 A1 | 5/2007 | Byers |
| 2007/0200479 A1 | 8/2007 | Jean |
| 2008/0213508 A1 | 9/2008 | Nagasawa |
| 2009/0059554 A1 | 3/2009 | Skipor |
| 2009/0096136 A1 | 4/2009 | Hawker |
| 2009/0294742 A1 | 12/2009 | Jang |
| 2010/0208493 A1 | 8/2010 | Choi |
| 2010/0224831 A1 | 9/2010 | Woo |
| 2011/0068322 A1 | 3/2011 | Pickett |
| 2011/0141769 A1 | 6/2011 | Lee |
| 2012/0001217 A1 * | 1/2012 | Kang ................... C09K 11/56 257/98 |
| 2012/0074449 A1 | 3/2012 | Park |
| 2012/0113672 A1 | 5/2012 | Dubrow |
| 2012/0241646 A1 | 9/2012 | Zhong |
| 2012/0270231 A1 | 10/2012 | Smith |
| 2013/0146834 A1 | 1/2013 | Cho |
| 2014/0264189 A1 * | 9/2014 | Furuta ................... C09K 11/02 252/512 |
| 2015/0083970 A1 | 3/2015 | Koh |
| 2015/0252234 A1 | 9/2015 | Okazaki |
| 2018/0282617 A1 * | 10/2018 | Qiu ........................ C09K 11/08 |
| 2019/0345379 A1 * | 11/2019 | Budd .................... C09K 11/70 |

FOREIGN PATENT DOCUMENTS

| | | |
|---|---|---|
| DE | 4128932 | 3/1993 |
| EP | 0824763 | 2/1998 |
| JP | S62-241924 | 10/1987 |
| JP | S63-241925 | 10/1988 |
| JP | 2007-262215 | 10/2007 |
| JP | 2010-164689 | 7/2010 |
| JP | 2011-162691 | 8/2011 |
| KR | 2011-122455 | 11/2011 |
| KR | 2015-070667 | 6/2015 |
| TW | 2009-36373 | 9/2009 |
| WO | WO 2000-029617 | 5/2000 |
| WO | WO 2001-044377 | 6/2001 |
| WO | WO 2008-005561 | 1/2008 |
| WO | WO 2008-140495 | 11/2008 |
| WO | WO 2009-136824 | 11/2009 |
| WO | WO 2009-137197 | 11/2009 |
| WO | WO 2010-052455 | 5/2010 |
| WO | WO 2010-120422 | 10/2010 |
| WO | WO 2012-042059 | 4/2012 |
| WO | WO 2012-126695 | 9/2012 |
| WO | WO 2012-163078 | 12/2012 |
| WO | WO 2013-021494 | 2/2013 |
| WO | WO 2013-078309 | 5/2013 |
| WO | WO 2013-191964 | 12/2013 |
| WO | WO 2014-113562 | 7/2014 |
| WO | WO 2014-147570 | 9/2014 |
| WO | WO 2015-102967 | 7/2015 |
| WO | WO 2015-187490 | 12/2015 |
| WO | WO 2016-081219 | 5/2016 |
| WO | WO 2016-167927 | 10/2016 |
| WO | WO 2016-168048 | 10/2016 |
| WO | WO 2017-030857 | 2/2017 |
| WO | WO 2017-117160 | 7/2017 |
| WO | WO 2017-117162 | 7/2017 |
| WO | WO 2017-200824 | 11/2017 |

OTHER PUBLICATIONS

Isnaeni, "Silica encapsulation of toluene soluble quantum dots with high photostability", Journal of Colloid and Interface Science, 2013, vol. 395, pp. 45-49.

Kim, "In situ ligand exchange of thiol-capped CuInS2/ZnS quantum dots at growth stage without affecting luminescent characteristics", J Colloid Interface Sci, 2011, vol. 363, pp. 703-706.

Luan, "Mercaptopropionic acid capped CdSe/ZnS quantum dots as fluorescence probe for lead(II)", J. Nanopart Res, 2012, vol. 14, No. 3, pp. 01-08.

Massadeh, "Synthesis and exploitation of InP/ZnS quantum dots for bioimaging", Proceedings of SPIE, 2009, vol. 7189, pp. 718902-1-718902-11.

Moon, "Phosphor concentration and geometry for high power white light emitting diode," Proc. of SPIE, 2010, vol. 7617, pp. 01-08.

Pong, "Modified Ligand-Exchange for Efficient Solubilization of CdSe/ZnS Quantum Dots in Water: A Procedure Guided by Computational Studies", Langmuir, 2008, vol. 24, No. 10, pp. 5270-5276.

Simic, "Gas barrier and adhesion of interpenetrating polymer networks based on poly(diurethane bismethacrylate) and different epoxy amine networks", European Polymer Journal, 2002, vol. 38, pp. 2449-2458.

Song, "Encapsulation of CdSe/ZnS nanocrystals within mesoporous silica spheres", Materials Research Bulletin, 2013, vol. 48, pp. 1530-1535.

Sorensen, "Fabrication of Stable Low-Density Silica Aerogels Containing Luminescent ZnS Capped CdSe Quantum Dots", Advanced Materials, 2006, vol. 18, pp. 1965-1967.

Wang, "Surface Modification of CdSe and CdSe/ZnS Semiconductor Nanocrystals with Poly (N,N-dimethylaminoethyl methacrylate)", Macromolecules, 2006, vol. 39, pp. 3664-3672.

International Search report for PCT International Application No. PCT/US2016/067661 dated Mar. 28, 2017, 5 pages.

* cited by examiner

CURABLE QUANTUM DOT COMPOSITIONS AND ARTICLES

CROSS REFERENCE TO RELATED APPLICATION

This application claims the benefit of U.S. Provisional Patent Application No. 62/273,894, filed Dec. 31, 2015, the disclosure of which is incorporated by reference herein in its entirety.

BACKGROUND

Light emitting semiconductor nanoparticles (also known as "quantum dots") such as CdSe or InP are useful as phosphor materials. Uses of quantum dots include display backlights for liquid crystal displays (LCD). Light from short wavelength light emitting diodes (LED) is converted to different desired visible wavelengths with narrow peaks by the quantum dots depending on the sizes of semiconductor nanoparticles. For example, a backlight can comprise blue emitting LEDs, and red and green emitting quantum dots that adsorb part of the blue light. Quantum dots can be used to create narrow emission peaks, resulting in displays with high color gamut. 3M markets a remote phosphor diffuser film product, QDEF (quantum dot enhancement film), using quantum dot emitters. The quantum dots in this product are embedded in a barrier matrix, which is sandwiched between two sheets of high barrier films for maximum protection of the quantum dots from degradation by atmospheric components such as oxygen and water vapor or moisture. Each sheet of barrier film has a high barrier thin coating including metal oxide coating layer(s).

SUMMARY

The present disclosure provides a curable composition that includes at least one polythiol, at least one polyalkene, and composite particles. The present disclosure further provides a cured article prepared from the curable composition.

In one aspect, the present disclosure provides a curable composition comprising: at least one polythiol; at least one polyalkene; and composite particles. The composite particles comprise: a hydrophobic nonmetallic inorganic matrix; quantum dots; and ligands; wherein the nonmetallic inorganic matrix is present in the composite particles in an amount of up to 40 volume percent. In some embodiments, the curable composition includes no more than 20% by weight of the composite particles, based on the total weight of the curable composition.

In one aspect, the present disclosure describes an article comprising composite particles in an organic polymer matrix comprising a cured thiol-alkene resin having a $T_g$ greater than 20° C. (in some embodiments, greater than 25° C., or even greater than 30° C.; in a range from 20° C. to 120° C.). The composite particles comprise a hydrophobic nonmetallic inorganic matrix, ligands, and quantum dots, wherein the nonmetallic inorganic matrix is present in the composite particles in an amount of up to 40 (in some embodiments, up to 35, 30, 25, or even up to 20; in some embodiments, in a range from 5 to 40, 5 to 30, or even 5 to 20) volume percent.

In some embodiments, the thiol-alkene polymer matrix is the cured reaction product of at least one polythiol and at least one polyalkene (polyalkenyl compound), wherein the functionality of both the polythiol and the polyalkene is at least 2 (in some embodiments at least one of which has a functionality of greater than 2).

As used herein:

"Thiol-alkene" refers to the un-cured or cured reaction mixture of at least one polythiol having at least two thiol (—SH) groups and at least one polyalkene compound having at least two alkenyl groups (or carbon-carbon double bond), wherein the polyalkene excludes from polyacrylate monomers and polymethacrylate monomers even though a small part of them (such as less than 20% by weight) may be blended with the polyalkene;

"Alkyl" means a linear or branched, cyclic or acylic, saturated monovalent hydrocarbon.

"alkylene" means a linear or branched unsaturated divalent hydrocarbon.

"Alkenyl" means a linear or branched unsaturated hydrocarbon.

"Aryl" means a monovalent aromatic (e.g., phenyl and naphthyl).

"Arylene" means a polyvalent, aromatic (e.g., phenylene and naphthalene).

"Aralkylene" means a group defined above with an aryl group attached to the alkylene (e.g., benzyl and 1-naphthylethyl).

"(Hetero)hydrocarbyl" is inclusive of hydrocarbyl alkyl and aryl groups, and heterohydrocarbyl heteroalkyl and heteroaryl groups, the later comprising at least one catenary (in-chain) heteroatoms such as ether or amino groups. Heterohydrocarbyl may optionally contain at least one catenary (in-chain) functional groups including ester, amide, urea, urethane, and carbonate functional groups. Unless otherwise indicated, the nonpolymeric (hetero)hydrocarbyl groups typically contain from 1 to 60 carbon atoms. Some examples of such heterohydrocarbyls as used herein include methoxy, ethoxy, propoxy, 4-diphenylaminobutyl, 2-(2'-phenoxyethoxy)ethyl, 3,6-dioxaheptyl, 3,6-dioxahexyl-6-phenyl, in addition to those described for "alkyl," "heteroalkyl," and "aryl" supra.

In some embodiments, articles comprising the composite particles and a thiol-alkene polymer matrix exhibit high stability in 85° C. storage tests described in the Examples.

Exemplary articles described herein can be made for use for display applications such as films, LED (i.e., light emitting diode) caps, LED coatings, LED lenses, and light guides. Exemplary articles described herein can be made for use for non-display applications such as security applications where quantum dot phosphors are used to provide fluorescence at selected or tailored wavelengths. In such uses, the organic polymer matrix could be a label or a coating on a label, or other articles such as a card or tag.

Herein, the term "hydrophobic" means a surface that is energetically unfavorable (i.e., it takes energy), to spread water on the surface. A bulk smooth surface of a hydrophobic material will have a contact angle greater than 90 degrees. Such properties are known in the art, and are associated with surfaces having certain chemical elements known to impart hydrophobicity (so called hydrophobic groups). A hydrophobic porous material will not absorb water by infiltration.

Herein, the terms "comprises" and "includes" and variations thereof do not have a limiting meaning where these terms appear in the description and claims. Such terms will be understood to imply the inclusion of a stated step or element or group of steps or elements but not the exclusion of any other step or element or group of steps or elements. By "consisting of" is meant including, and limited to, whatever follows the phrase "consisting of." Thus, the phrase "consisting of" indicates that the listed elements are required or mandatory, and that no other elements may be present. By "consisting essentially of" is meant including any elements listed after the phrase, and limited to other elements that do not interfere with or contribute to the activity or action specified in the disclosure for the listed elements. Thus, the phrase "consisting essentially of" indicates that the listed elements are required or mandatory, but that other elements are optional and may or may not be present depending upon whether or not they materially affect the activity or action of the listed elements.

The words "preferred" and "preferably" refer to claims of the disclosure that may afford certain benefits, under certain circumstances. However, other claims may also be preferred, under the same or other circumstances. Furthermore, the recitation of one or more preferred claims does not imply that other claims are not useful, and is not intended to exclude other claims from the scope of the disclosure.

In this application, terms such as "a," "an," and "the" are not intended to refer to only a singular entity, but include the general class of which a specific example may be used for illustration. The terms "a," "an," and "the" are used interchangeably with the term "at least one." The phrases "at least one of" and "includes at least one of" followed by a list refers to any one of the items in the list and any combination of two or more items in the list.

As used herein, the term "or" is generally employed in its usual sense including "and/or" unless the content clearly dictates otherwise.

The term "and/or" means one or all of the listed elements or a combination of any two or more of the listed elements.

Also herein, all numbers are assumed to be modified by the term "about" and in certain embodiments, preferably, by the term "exactly." As used herein in connection with a measured quantity, the term "about" refers to that variation in the measured quantity as would be expected by the skilled artisan making the measurement and exercising a level of care commensurate with the objective of the measurement and the precision of the measuring equipment used. Herein, "up to" a number (e.g., up to 50) includes the number (e.g., 50).

Also herein, the recitations of numerical ranges by endpoints include all numbers subsumed within that range as well as the endpoints (e.g., 1 to 5 includes 1, 1.5, 2, 2.75, 3, 3.80, 4, 5, etc.).

As used herein, the term "room temperature" refers to a temperature of 20° C. to 25° C. or 22° C. to 25° C.

The above summary of the present disclosure is not intended to describe each disclosed embodiment or every implementation of the present disclosure. The description that follows more particularly exemplifies illustrative embodiments. In several places throughout the application, guidance is provided through lists of examples, which examples may be used in various combinations. In each instance, the recited list serves only as a representative group and should not be interpreted as an exclusive list.

DETAILED DESCRIPTION OF ILLUSTRATIVE EMBODIMENTS

The present disclosure provides a curable composition that includes at least one polythiol, at least one polyalkene, and composite particles. The present disclosure further provides a cured article prepared from the curable composition.

Figure 1:
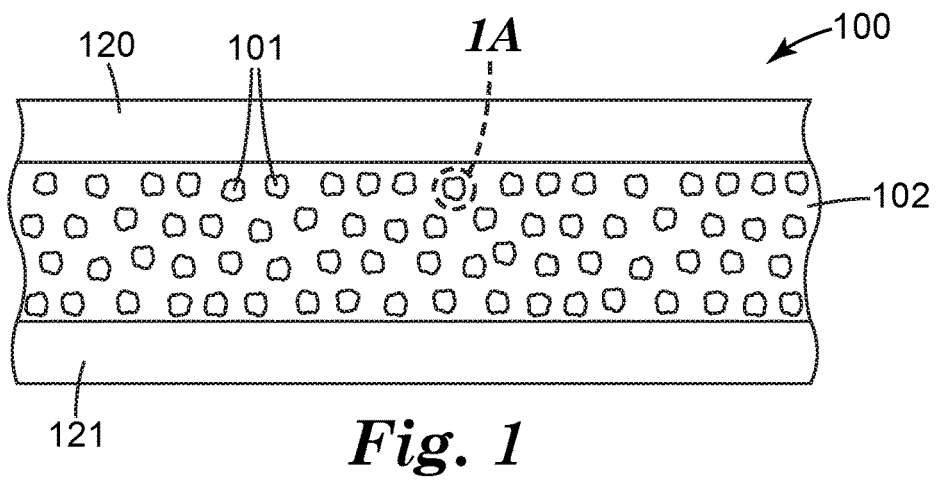
FIG. 1 is a cross-sectional view of an exemplary article described herein.
Figure 1A:
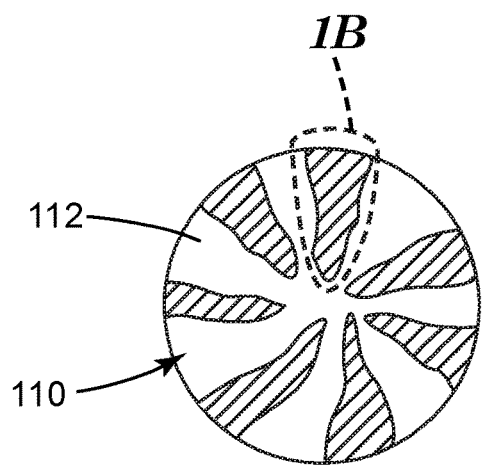
FIG. 1A is a cross-sectional view of an exemplary particle shown in FIG. 1.
Figure 1B:
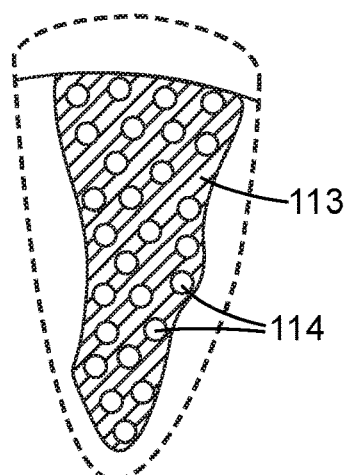
FIG. 1B is a cross-sectional view of a portion of the exemplary particle shown in FIG. 1A showing further detail.

Referring to the FIGS. 1, 1A, and 1B, article 100 includes composite particles 101 described herein in an organic polymer matrix 102. As shown, particles 101 and organic polymer matrix 102 are disposed between substrates (e.g., barrier films) 120, 121. Composite particles (101 in FIGS. 1 and 110 in FIG. 1A) include a hydrophobic non-metallic inorganic matrix 112 that includes pores (expanded version of one pore shown in FIG. 1B) that include ligands 113 and quantum dots 114. In some embodiments, the composite particles include up to 40 volume percent of the nonmetallic inorganic matrix.

In general, composite particles described herein can be made by a method comprising: providing a liquid having quantum dots dispersed therein; and infiltrating the liquid having the quantum dots into a porous nonmetallic inorganic particle. In some embodiments, the liquid having quantum dots dispersed therein comprises up to 50 (in some embodiments, up to 45, 40, 35, 30, or up to 25; in some embodiments, in a range from 5 to 30, 5 to 25, or even 10 to 20) weight percent quantum dots.

In some embodiments, the present disclosure provides a curable composition that includes at least one polythiol, at least one polyalkene, and composite particles, wherein the composite particles include a hydrophobic nonmetallic inorganic matrix, quantum dots, and ligands. In some embodiments, the curable composition includes no more than 20% by weight of the composite particles, based on the total weight of the curable composition.

In some embodiments, the present disclosure provides a cured article that includes a cured organic polymer matrix derived from at least one polythiol and at least one polyalkene, and composite particles, disposed between two substrates (e.g., barrier films).

In some embodiments, the nonmetallic inorganic matrix is present in a composite particle in an amount of up to 40 (in some embodiments, up to 35, 30, 25, or even up to 20; in some embodiments, in a range from 5 to 40, 5 to 30, or even 5 to 20) volume percent.

Films of the present disclosure exhibit desirable properties. The efficiency of the quantum dots is typically enhanced by the organic polymer matrix. The films typically exhibit high stability (for example, low edge ingress and high color stability). Surprisingly, when the quantum dots and ligands are contained within composite particles (for example, within mesoporous hydrophobic silica particles), even higher levels of stability are exhibited, and unexpectedly, the efficiency of the quantum dots is enhanced by the organic polymer matrix, despite the fact that the quantum dots and ligands are contained within the composite particles.

Hydrophobic Nonmetallic Inorganic Matrix

The composite particles include a nonmetallic inorganic matrix that has a hydrophobic surface.

The surface of nonmetallic inorganic matrix can be made hydrophobic, for example, by treatment with a silane or other agent with a hydrophobic group. For example, the surface of silica or metal oxide particles can be modified with hydrophobic organic groups.

Exemplary hydrophobic groups include $Me_3Si$-groups, a variety of hydrocarbon and fluorocarbon groups such as simple alkyl groups (dimethyl, trimethyl, diethyl, triethyl), long chain alkanes such as $C_8$ (octane), and $C_{18}$ (octadecyl), fluoromaterials such as tetrafluoroethylene, alkenes such as propylene, and mixed groups such as heptadecafluorodecyl.

In some embodiments, porous nonmetallic inorganic particles useful for making the composite particles that are in the organic polymer matrix comprise pores and nonmetallic inorganic matrix. The composite particles are prepared by infiltrating porous inorganic particles with quantum dots plus ligands, e.g., liquid ligands, and an optional solvent. In particular, porous inorganic particles are selected that have a relatively high volume fraction of very small pores to enable a high loading of quantum dots plus ligands to form the composite particles.

The nonmetallic inorganic matrix of the composite particles comprises at least one of silica, metal (e.g., Al, Ti, Zr, Mg, and Zn) oxide, metal nitride, metal sulfide, metal oxysulfide, or metal oxynitride. Exemplary metal oxides include forms such as hydroxides, hydrous oxides, and as well as forms with mixed anions (e.g., oxide plus halides, hydroxyls, small amounts of alkyls or carboxylates, etc.).

The porous nonmetallic inorganic particle (and the nonmetallic inorganic matrix of the composite particles) can be amorphous, crystalline, or mixed, single or multiphase, and can contain one or more cations and one or more anions, mixed oxides, hydrous oxides. The porous nonmetallic inorganic particles can be made by techniques known in the art. For example, chemically derived porous metal oxide particles can be made by growth from alkoxide solutions or nanoparticle sols. Exemplary methods also include emulsion processes, or atomization of aqueous chemical precursors into oils or gelling media (see, e.g., "From Molecules to Systems: Sol-Gel Microencapsulation in Silica-Based Materials," Rosaria Ciriminna, Marzia Sciortino, Giuseppe Alonzo, Aster de Schrijver, and Mario Pagliaro, *Chem. Rev.*, 2011, 111 (2), pp. 765-789). Dried chemically derived particles are sometimes called xerogels. Xerogel particles can be heated to remove residual solvents and organics, but should be processed at temperatures such that sufficient sintering does not occur to eliminate desired porosity.

In some embodiments, the porous nonmetallic inorganic particles are aerogel granules. Aerogels have very high pore volume (e.g., 60%-95%) and very fine pores (e.g., 5 nm-100 nm in diameter). Aerogels are formed by processing gels so as to remove solvent without inducing shrinkage or collapse of the structure as would normally occur due to surface tension forces. The surfaces of aerogels may be treated with a desired functionality (e.g., a hydrophobic functional group).

Pre-formed porous particles (e.g., pre-formed aerogels) provide the advantage of not exposing quantum dots to the aerogel synthesis process. Other useful pre-formed porous particles include those known in the art, for example, as chromatography media.

Porous nonmetallic inorganic particles can be formed by techniques known in the art. For example, fine powders of desired materials can be formed into agglomerate particles (e.g., by spray drying), and partially sintered to yield porous particles.

In some embodiments, the porous nonmetallic inorganic particles (prior to filling with quantum dots and ligand systems) are greater than 50 (in some embodiments, at least 55, 60, 70, or even at least 75; in some embodiments, in a range from 50 to 75, or even 60 to 90) volume percent porous.

In some embodiments, the porous nonmetallic inorganic particles comprise a mesoporous structure.

In some embodiments, the porous nonmetallic inorganic particles have an average pore size, if components of the composite particles other than the nonmetallic inorganic matrix were not present, of not greater than 250 nm (in some embodiments, not greater than 200 nm, 150 nm, 100 nm, 75 nm, 50 nm, 25 nm, or even not greater than 10 nm; in some embodiments, in a range from 5 nm to 250 nm, 5 nm to 200 nm, 5 nm to 150 nm, 5 nm to 100 nm, 5 nm to 75 nm, 5 nm to 50 nm, 5 nm to 25 nm, or even 10 nm to 100 nm).

In some embodiments, the particles described herein are in a range from 10 micrometers to 100 micrometers (in some embodiments, in a range from 20 micrometers to 50 micrometers).

Quantum Dots

Quantum dots (light emitting semiconductor nanoparticles) are commercially available, for example, from Nanosys, Inc., Milpitas, Calif., and are typically provided with the quantum dots in a liquid (e.g., a solvent such as toluene, or a liquid ligand system). In some embodiments, the quantum dots comprise at least one of ZnS, ZnSe, CdS, CdSe, PbS, InP, InAs, GaAs, GaP, Si, or Ge. In some embodiments, the quantum dots comprise CdSe or InP nanoparticles. Typically, the quantum dots comprise so-called core-shell structures, with a core of the desired semiconductor nanoparticle, and at least one shell of additional material that provides desired stability and surface chemical or electronic properties.

Exemplary materials include CdSe core-CdS intermediate layer, and a ZnS shell. In one embodiment, the quantum dots have a CdSe core, a ZnSe middle layer, and a ZnS shell. In another embodiment, the structure is an InP core-ZnSe intermediate layer-ZnS shell. It is to be understood there is a distinct difference between the core of a quantum dot (typically less than 4 nm in diameter), and the core region of the composite particles described herein (typically at least micrometers or tens of micrometers in diameter).

Stabilizing Ligands

Quantum dots (light emitting semiconductor nanoparticles) typically have selected molecules, oligomers, or polymers having optimized functional groups bound to their surfaces, resulting in a desirable local ligand environment for atoms at the surfaces of the quantum dots. Generally, certain ligands are present during the growth process used to synthesize the quantum dots. Often, these ligands are replaced or exchanged at a later time to provide a new ligand environment selected to optimize properties.

Ligands perform several functions. They help prevent quantum dots from clustering and quenching, they can improve the chemical stability of the quantum dot surface, and they can improve the emission efficiency of the quantum dots. Ligand systems can include several forms. In general, they can include molecules or functional groups directly bound to quantum dots, and optionally, additional material. The additional material can be liquid or solid, and can be the same composition or a different composition compared to the bound material (e.g., a ligand system could comprise a bound species and a solvent).

An example of a ligand system for CdSe-based quantum dots is a liquid aminosilicone type oil with both bound material and additional material of similar composition. An example of a ligand system for InP-based quantum dots is bound medium chain carboxylic acid species with a solid polymer (e.g., isobornyl methacrylate) as an additional material, or with carboxylate groups in the polymer (e.g., copolymer of isobornyl methacrylate and methacrylic acid) bonded to the quantum dots as well.

Composite particles described herein can be advantageous in that they can maintain a desirable ligand environment, including an environment comprising a liquid ligand system or solvent.

Exemplary desirable properties of ligand systems for composite particles and processes include stability at process temperatures and favorable infiltration behavior. Surprisingly, CdSe-based quantum dots in an aminosilicone oil ligand system infiltrate readily into both hydrophobic treated porous silica particles, and untreated hydrophilic silica particles. In addition, these materials have been found to be stable to process temperatures of at least 200° C.

In some embodiments, the ligand system can be a liquid at the time of infiltration, and subsequently converted to a solid by curing, polymerization, or solvent removal. In some embodiments, the ligands include at least one organic, organometallic, or polymeric ligand. Suitable ligands include polymers, glassy polymers, silicones, carboxylic acid, dicarboxylic acid, poly-carboxylic acid, acrylic acid, phosphonic acid, phosphonate, phosphine, phosphine oxide, sulfur, amines, amines which combine with epoxies to form an epoxy, monomers of any of the polymeric ligands mentioned herein, or any suitable combination of these materials. The quantum dot ligands can include amine-containing organic polymers such as aminosilicone (AMS) (available, for example, under the trade designations "AMS-242" and "AMS-233" from Gelest, Morrisville, Pa.), and "GP-998" (from Genesee Polymers Corp., Burton, Mich.); and polyether amines (available, for example, under the trade designation "JEFFAMINE" from Huntsman Corporation, The Woodlands, Tex.).

Suitable ligands include ligands having at least one quantum dot-binding moiety (e.g., an amine moiety or a dicarboxylic acid moiety). Exemplary amine ligands include aliphatic amines (e.g., decylamine or octylamine, and polymeric amines).

Nonvolatile liquid ligands comprise sufficiently high molecular weight liquid versions of the chemistries described above. Typically, liquid ligands comprising monomers or polymers having chemical backbones of at least about eight units long, or chemical species with carbon chains of about eight units or more, and having little or no additional shorter chain volatile solvents provide nonvolatile ligand systems. Examples of nonvolatile liquid ligand systems include any of the aminosilicone materials listed above, $C_8$ compounds (e.g., isooctyl acrylate and isooctyl methacrylate, trioctyl phosphate, and dioctyl phosphonate), fluorocarbons and fluoropolymers (e.g., hexafluoropropylene oxide), and poly-ether amine (available, for example, under the trade designation "JEFFAMINE" from Huntsman Corporation).

The liquid that is infiltrated into the porous nonmetallic inorganic particles can comprise a liquid ligand system with both bound and unbound ligands, additional solvents, other dissolved components such as organic polymers, quantum dots, and other components (e.g., monomers, or surfactants).

Infiltration of a liquid containing quantum dots into a porous nonmetallic inorganic matrix can be done by mixing particles or granules of porous nonmetallic inorganic matrix material with the liquid. In some embodiments, the volume of liquid is chosen to be a large fraction of the available pore volume (e.g., the volume of liquid is 50 to 99% of the pore volume). In some embodiments, wherein the quantum dots are in a viscous liquid ligand system, a solvent can be used to facilitate infiltration. Optionally, the solvent can be removed by, for example, vacuum drying, following infiltration. In some embodiments, the nonmetallic inorganic matrix material can be chosen or designed such that some shrinking occurs during drying, resulting in a composite particle with a high fill fraction.

In some embodiments, grinding is desirable after infiltration. Grinding can be done using common grinding or milling methods in an inert atmosphere.

In some embodiments, collectively the ligands and the quantum dots are present in the composite particles in an amount of at least 60 (in some embodiments, at least 65, 70, 75, 80, 85, or even at least 90; in some embodiments, in a range from 60 to 95, or even 70 to 95) volume percent.

In some embodiments, the composite particles further comprises a liquid (e.g., a non-volatile liquid ligand system such as aminosilicone oil). In some embodiments, collectively the liquid, the ligands, and the quantum dots are present in the composite particles in an amount of greater than 50 (in some embodiments, at least 55, 60, 70, or even at least 75; in some embodiments, in a range from 50 to 75, or even 60 to 95) volume percent. In some embodiments, the quantum dots, the ligands, and the liquid are in the form of a liquid-ligand system.

The liquid is understood to be a liquid material comprising the quantum dots, ligands bound to the quantum dots, and additional materials that are part of or within the liquid. The additional materials can comprise, for example, unbound ligands, solvents, dissolved solids (materials that are solids when separate from and not dissolved in a liquid), and other dissolved or dispersed liquid components (e.g., solvents, liquid monomers, liquid organic polymers, and oils).

In some embodiments, the ligands include at least one of an amine functional silicone, a carboxylic acid functional silicone, a bound ligand plus a solvent or carrier liquid, and a curable component.

In some embodiments, the composite particles may further comprise an organic polymer. In some embodiments, the organic polymer is at least one of an acrylate or an epoxy.

In some embodiments, collectively the liquid, the ligands, the organic polymer, and the quantum dots are present in the composite particles in an amount of greater than 50 (in some embodiments, at least 55, 60, 70, or even at least 75; in some embodiments, in a range from 50 to 75, or even 60 to 95) volume percent.

Thiol-Alkene Matrix

The cured thiol-alkene polymer matrix or binder is the cured reaction product of at least one polythiol and at least one polyalkene (polyalkenyl compound), wherein the functionality of both the polythiol and the polyalkene is at least 2 (in some embodiments at least one of which has a functionality of greater than 2). In some embodiments, both the polythiol and polyalkene have a functionality of >2.

The polythiol reactant in the thiol-alkene resin is of the formula:

$$R^2(SH)_y \tag{I}$$

wherein $R^2$ is a (hetero)hydrocarbyl group having a valence of y, where y is ≥2 (in some embodiments, y is >2). The thiol groups of the polythiols may be primary or secondary. The compounds of Formula I may include a mixture of polythiol compounds having an average functionality of at least two. $R^2$ includes any (hetero)hydrocarbyl groups, including aliphatic and aromatic polythiols. $R^2$ may optionally further include at least one functional group including pendent hydroxyl, acid, ester, or cyano groups or catenary (in-chain) ether, urea, urethane and ester groups.

In some embodiments, $R^2$ comprises aliphatic or cycloaliphatic moiety having from 1 to 30 carbon atoms. In another embodiment, $R^2$ is oligomeric moiety derived from carbon-carbon double bonds, polyisocyanurates, polycarboxylic acids or polyols having pendent or terminal reactive —SH groups. In another embodiment, $R^2$ is polymeric and comprises a polyoxyalkylene, polyester, polyolefin, polyacrylate, or polysiloxane polymer having pendent or terminal reactive —SH groups. Useful oligomers and polymers include, for example, thiol-terminated polyethylenes or polypropylenes, and thiol-terminated poly(alkylene oxides).

Exemplary polythiols include 2,3-dimercapto-1-propanol, 2-mercaptoethyl ether, 2-mercaptoethyl sulfide, 1,6-hexanedithiol, 1,8-octanedithiol, 1,8-dimercapto-3,6-dithiaoctane, propane-1,2,3-trithiol, and trithiocyanuric acid.

Another exemplary class of polythiols include those obtained by esterification of a polyol with a terminally thiol-substituted carboxylic acid (or derivative thereof (e.g., esters or acyl halides)) including α- or β-mercaptocarboxylic acids (e.g., thioglycolic acid, β-mercaptopropionic acid, 2-mercaptobutyric acid, or esters thereof).

Exemplary commercially available compounds include ethylene glycol bis(thioglycolate), pentaerythritol tetrakis(3-mercaptopropionate), dipentaerythritol hexakis(3-mercaptopropionate), ethylene glycol bis(3-mercaptopropionate), trimethylolpropane tris(thioglycolate), trimethylolpropane tris(3-mercaptopropionate), pentaerythritol tetrakis(thioglycolate), pentaerythritol tetrakis(3-mercaptopropionate), pentaerythritol tetrakis (3-mercaptobutylate), 1,4-bis-3-mercaptobutyloxy butane, tris[2-(3-mercaptopropionyloxy)ethyl] isocyanurate, trimethylolpropane tris(mercaptoacetate), 2,4-bis(mercaptomethyl)-1,3,5-triazine-2,4-dithiol, 2-(3-di(2-mercaptoethyl)thio)-1-propanethiol, dimercaptodiethylsufide, ethoxylated trimethylpropan-tri(3-mercaptopropionate), and pentaerythritol tetramercaptoacetate.

A specific example of a polymeric polythiol is polypropylene ether glycol bis(3-mercaptopropionate) which is prepared by esterification of polypropylene-ether glycol (available, for example, under the trade designation "PLURACOL P201" from BASF Wyandotte Chemical Corp., Florham Park, N.J.), and 3-mercaptopropionic acid by esterification.

Useful soluble, high molecular weight thiols include polyethylene glycol di(2-mercaptoacetate), (available, for example, under the trade designation "LP-3" from Morton Thiokol Inc., Trenton, N.J.), and polythiol blends (available, for example, under the trade designation "PERMAPOL P3" from Products Research & Chemical Corp., Glendale, Calif.) and compounds such as the adduct of 2-mercaptoethylamine and caprolactam.

The curable composition contains a polyalkene. Exemplary polyalkenes include terminal polyalkene, poly(vinyl ether), poly(allyl ether), or poly(allyl amine). In some embodiments, polyalkenes inlcude allyl pentaerythritol, bisphenol A diallyl ether, o,o'-diallyl bisphenol A, triallyl isocyanurate, triallyl cyanurate, diallyl phthalate, diallyl isophthalate, diallyl terephthalate, aliphatic allyl oligomer (available for example, from Sartomer, Exton, Pa. under the trade designation "CN9101"), and aliphatic allyl urethane (available for example, from Sartomer under the trade designation "CN9102"). The polyalkene has at least two reactive alkene groups. Such polyalkene are of the general formula:

$$R^1\text{---}[CR^{10}\text{=}CHR^{11}]_x \qquad \text{(II)}$$

wherein:
$R^1$ is a polyvalent (hetero)hydrocarbyl group,
each of $R^{10}$ and $R^{11}$ are independently H or $C_1$-$C_4$ alkyl; and
x is ≥2.

The compounds of Formula II may include vinyl ethers.

In some embodiments, $R^1$ is an aliphatic or aromatic group. $R^1$ can be selected from alkyl groups of 1 to 20 carbon atoms or aryl aromatic group containing 6-18 ring atoms. $R^2$ has a valence of x, where x is at least 2 (in some embodiments, greater than 2). $R^1$ optionally contains at least one or more esters, amide, ether, thioether, urethane, or urea functional groups. The compounds of Formula I may include a mixture of compounds having an average functionality of at least two or greater. In some embodiments, $R^{10}$ and $R^{11}$ may be taken together to form a ring.

In some embodiments, $R^1$ is a heterocyclic group. Heterocyclic groups include both aromatic and non-aromatic ring systems that contain at least one nitrogen, oxygen, or sulfur heteroatom. Suitable heteroaryl groups include furyl, thienyl, pyridyl, quinolinyl, tetrazolyl, imidazo, and triazinyl. The heterocyclic groups can be unsubstituted or substituted by at least one substituent of alkyl, alkoxy, alkylthio, hydroxy, halogen, haloalkyl, polyhaloalkyl, perhaloalkyl (e.g., trifluoromethyl), trifluoroalkoxy (e.g., trifluoromethoxy), nitro, amino, alkylamino, dialkylamino, alkylcarbonyl, alkenylcarbonyl, arylcarbonyl, heteroarylcarbonyl, aryl, arylalkyl, heteroaryl, heteroarylalkyl, heterocyclyl, heterocycloalkyl, nitrile, or alkoxycarbonyl.

In some embodiments, the alkene compound is the reaction product of a mono- or polyisocyanate:

$$R^3(NCO)x + HX^1\text{---}R^5(CR^{10}\text{=}CHR^{11})y \rightarrow R^3[NH\text{---}C(O)\text{---}X^1\text{---}R^5(CR^{10}\text{=}CHR^{11})y]x$$

wherein:
$R^3$ is a (hetero)hydrocarbyl group;
$X^1$ is —O—, —S— or —NR$^4$—, where $R^4$ is H of $C_1$-$C_4$ alkyl;
each of $R^{10}$ and $R^{11}$ are independently H or $C_1$-$C_4$ alkyl;
$R^5$ is a (hetero)hydrocarbyl group; and
x and y are at least 1, and at least one of them is at least 2.

In some embodiments, $R^5$ may be alkylene, arylene, alkarylene, aralkylene, with optional in-chain heteratoms. $R^5$ can be selected from alkyl groups of 1 to 20 carbon atoms or aryl aromatic group containing 6-18 ring atoms. $R^2$ has a valence of x, where x is at least 2 (in some embodiments, greater than 2). $R^1$ optionally contains at least one, amide, ether, thioether, urethane, or urea functional group.

Polyisocyanate compounds useful in preparing the alkene compounds comprise isocyanate groups attached to the multivalent organic group that can comprise, in some embodiments, a multivalent aliphatic, alicyclic, or aromatic moiety ($R^3$); or a multivalent aliphatic, alicyclic or aromatic moiety attached to a biuret, an isocyanurate, or a uretdione, or mixtures thereof. In some embodiments, polyfunctional isocyanate compounds contain at least two isocyanate (—NCO) radicals. Compounds containing at least two —NCO radicals include, for example, those comprised of di- or trivalent aliphatic, alicyclic, aralkyl, or aromatic groups to which the —NCO radicals are attached.

Representative examples of suitable polyisocyanate compounds include isocyanate functional derivatives of the polyisocyanate compounds as defined herein. Examples of derivatives include those selected from the group consisting of ureas, biurets, allophanates, dimers and trimers (e.g., uretdiones and isocyanurates) of isocyanate compounds, and mixtures thereof. Any suitable organic polyisocyanate (e.g., an aliphatic, alicyclic, aralkyl, or aromatic polyisocyanate) may be used either singularly or in mixtures of at least two.

The aliphatic polyisocyanate compounds generally provide better light stability than the aromatic compounds. Aromatic polyisocyanate compounds, on the other hand, are generally more economical and reactive toward nucleophiles than are aliphatic polyisocyanate compounds. Suitable aromatic polyisocyanate compounds include those selected from the group consisting of 2,4-toluene diisocyanate (TDI), 2,6-toluene diisocyanate, an adduct of TDI with trimethylolpropane (available, for example, under the trade designation "DESMODUR CB" from Bayer Corporation, Pittsburgh, Pa.), the isocyanurate trimer of 2,2,4-trimethyl-hexamethylene diisocyanate (TDI) (available, for example, under the trade designation "DESMODUR IL" from Bayer Corporation), diphenylmethane 4,4'-diisocyanate (MDI), diphenylmethane 2,4'-diisocyanate, 1,5-diisocyanato-naphthalene, 1,4-phenylene diisocyanate, 1,3-phenylene diisocyanate, 1-methyoxy-2,4-phenylene diisocyanate, 1-chlorophenyl-2,4-diisocyanate, and mixtures thereof.

Exemplary alicyclic polyisocyanate compounds include those selected from the group consisting of dicyclohexylmethane diisocyanate ($H_{12}$ MDI, available, for example, under the trade designation "DESMODUR" from Bayer Corporation), 4,4'-isopropyl-bis(cyclohexylisocyanate), isophorone diisocyanate (IPDI), cyclobutane-1,3-diisocyanate, cyclohexane 1,3-diisocyanate, cyclohexane 1,4-diisocyanate (CHDI), 1,4-cyclohexanebis(methylene isocyanate) (BDI), dimer acid diisocyanate (available from Bayer), 1,3-bis(isocyanatomethyl)cyclohexane ($H_6$ XDI), 3-isocyanatomethyl-3,5,5-trimethylcyclohexyl isocyanate, and mixtures thereof.

Exemplary aliphatic polyisocyanate compounds include tetramethylene 1,4-diisocyanate, hexamethylene 1,4-diisocyanate, hexamethylene 1,6-diisocyanate (HDI), octamethylene 1,8-diisocyanate, 1,12-diisocyanatododecane, 2,2,4-trimethyl-hexamethylene diisocyanate (TMDI), 2-methyl-1,5-pentamethylene diisocyanate, dimer diisocyanate, the urea of hexamethylene diisocyanate, the biuret of hexamethylene 1,6-diisocyanate (HDI) (available, for example, under the trade designations "DESMODUR N-100" and "DESMODUR N-3200" from Bayer Corporation), the isocyanurate of HDI (available, for example, under the trade designations "DESMODUR N3300" and "DESMODUR N-3600" from Bayer Corporation, Pittsburgh, Pa.), a blend of the isocyanurate of HDI and the uretdione of HDI (available, for example, under the trade designation "DESMODUR N3300" from Bayer Corporation), and mixtures thereof.

Exemplary aralkyl polyisocyanates (having alkyl substituted aryl groups) include m-tetramethyl xylylene diisocyanate (m-TMXDI), p-tetramethyl xylylene diisocyanate (p-TMXDI), 1,4-xylylene diisocyanate (XDI), 1,3-xylylene diisocyanate, p-(1-isocyanatoethyl)phenyl isocyanate, m-(3-isocyanatobutyl)phenyl isocyanate, 4-(2-isocyanatocyclohexyl-methyl)phenyl isocyanate, and mixtures thereof.

Exemplary polyisocyanates include 2,2,4-trimethyl-hexamethylene diisocyanate (TMDI), tetramethylene 1,4-diisocyanate, hexamethylene 1,4-diisocyanate, hexamethylene 1,6-diisocyanate (HDI), octamethylene 1,8-diisocyanate, 1,12-diisocyanatododecane, mixtures thereof, and a biuret, an isocyanurate, or a uretdione derivative.

In some embodiments, the polyalkene compound is a cyanurate or isocyanurate of the formulas:

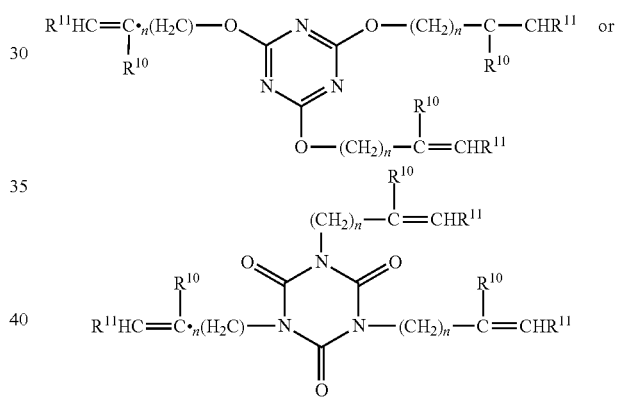

wherein n is at least one;
each of $R^{10}$ and $R^{11}$ are independently H or $C_1$-$C_4$ alkyl.

The polyalkene compounds may be prepared, for example, as the reaction product of a polythiol compound and an epoxy-alkene compound via thiol-epoxy ring opening reaction as shown below.

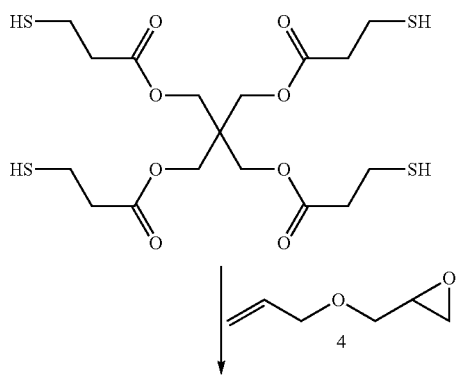

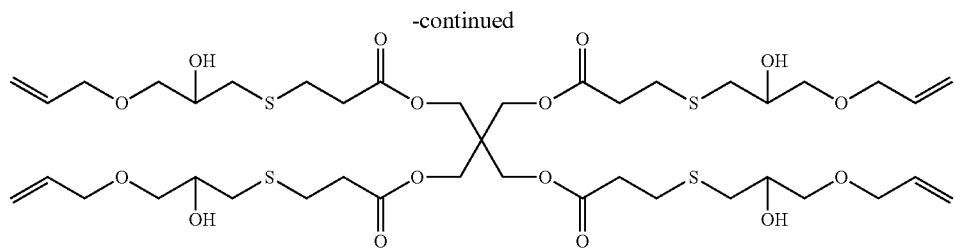

Similarly, the polyalkene compound may be prepared, for example, by reaction of a polythiol with a di- or higher epoxy compound, followed by reaction with an epoxy-alkene compound.

The polyalkene may be prepared, for example, by reaction of a hydroxy-functional polyalkenyl compound, such as $(CH_2=CH-CH_2-O)_y-R-OH$ with a polyepoxy compound or a polyisocyanate.

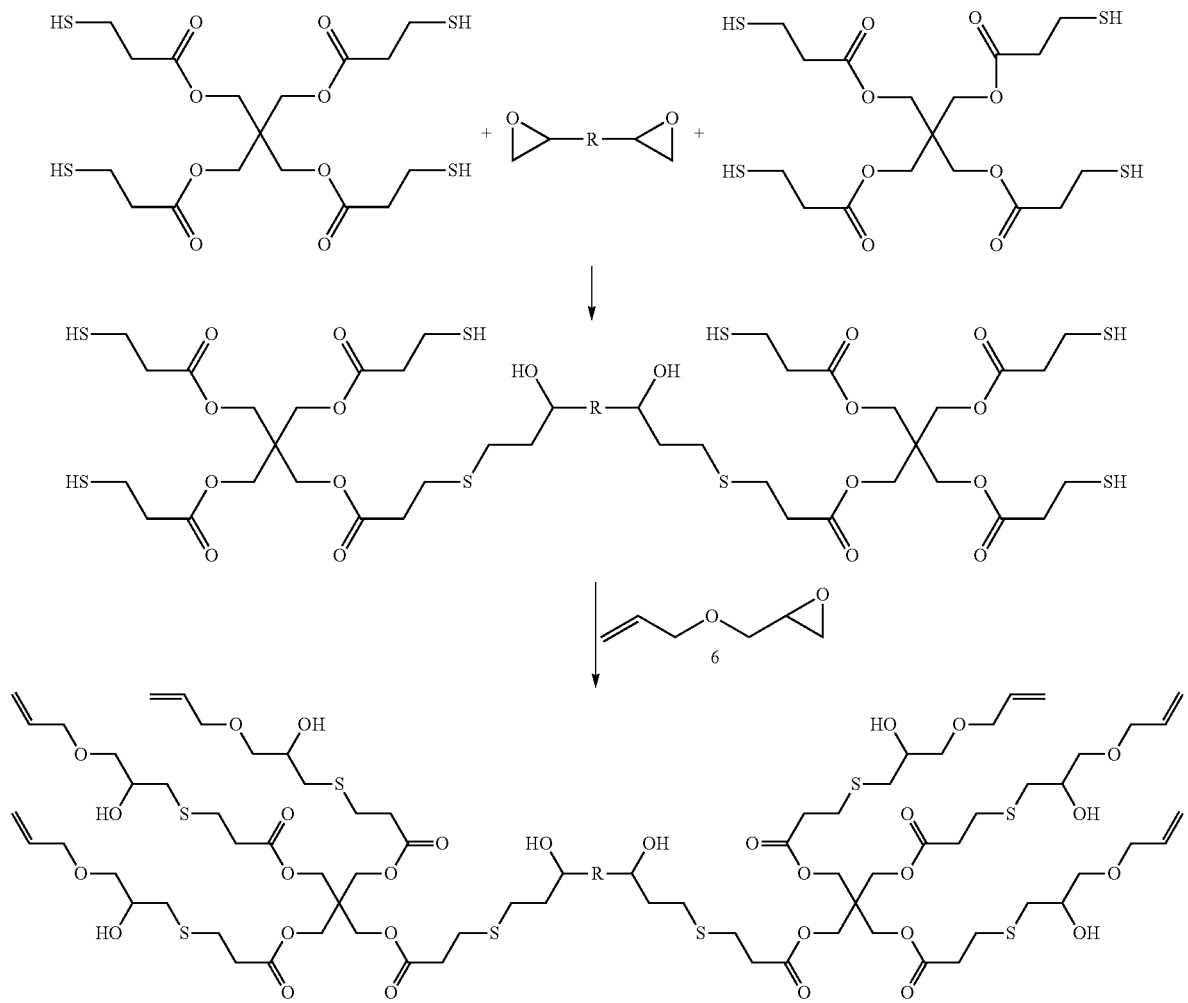

Alternatively, for example, a polyamino compound may be reacted with an epoxy-alkene compound, or a polyamino compound may be reacted with a di- or higher epoxy compound, followed by reaction with an epoxy-alkene compound.

The polyalkene may be prepared, for example, by reaction of a bis-alkenyl amine, such a $HN(CH_2CH=CH_2)_2$, with either a di- or higher epoxy compound, or with a bis- or high (meth)acrylate, or a polyisocyanate.

An oligomeric polyalkene may be prepared, for example, by reaction between a hydroxyalkyl (meth)acrylate and an allyl glycidyl ether.

In some embodiments, the polyalkene and/or the polythiol compounds are oligomeric and prepared, for example, by reaction of the two with one in excess. For example, polythiols of Formula I may be reacted with an excess of polyalkenes of Formula I such that an oligomeric polyalkene results having a functionality of at least two as shown below. Conversely an excess of polythiols of Formula I may be reacted, for example, with the polyalkenes of Formula II such that an oligomeric polythiol results having a functionality of at least two. The oligomeric polyalkenes and polythiols may be represented by the following formulas, where subscript z is two or greater. $R^1$, $R^2$, $R^{10}$, $R^{11}$, y and x are as previously defined.

In the following formulas, a linear thiol-alkene polymer is shown for simplicity. It will be understood that the pendent ene group of the first polymer will have reacted with the excess thiol, and the pendent thiol groups of the second polymer will have reacted with the excess alkene.

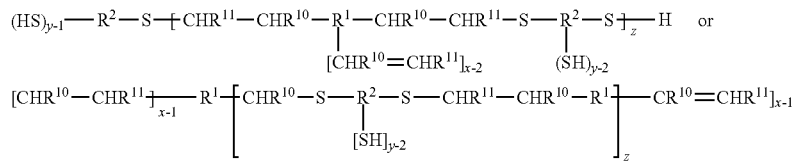

Representative thiolether polyalkene oligomers with one terminal ene reacted are demonstrated below.

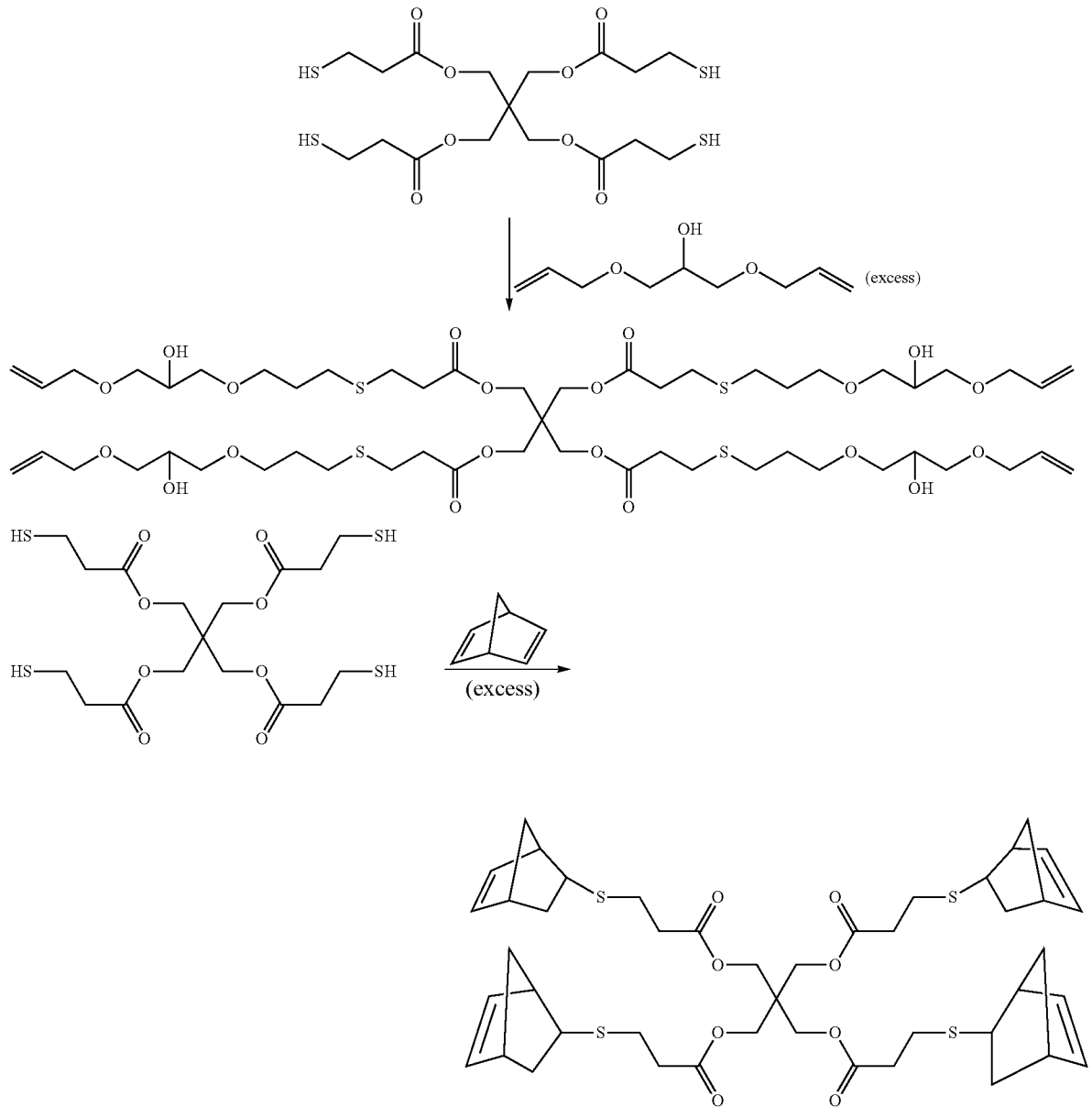

In some embodiments, additional (meth)acrylates in limited amounts may be combined with polyalkene in the thiol-alkene polymer matrix binder composition. In some embodiments, a radiation curable (meth)acrylate compound can adjust the viscosity of the composition used to form the polymer matrix and can reduce defects that would otherwise be created during the thermal acceleration of the thiol-alkene resin. Exemplary radiation curable (meth)acrylate compounds have barrier properties to minimize the ingress of water and/or oxygen. In some embodiments, (meth)acrylate compounds with a glass transition temperature ($T_g$) of greater than about 50° C., preferably greater than about 80° C., and most preferably greater than 100° C. based on the homopolymer of (meth)acrylates, and substituents capable of forming high crosslink densities can provide a polymer matrix with improved gas and water vapor barrier properties. In some embodiments, the radiation curable (meth)acrylate compound is multifunctional (available, for example, under the trade designations "SR 348" (ethoxylated (2) bisphenol A di(meth)acrylate), "SR 349" (ethoxylated (2) bisphenol A diacrylate), "SR540" (ethoxylated (4) bisphenol A di(meth) acrylate), and "SR239" (1,6-hexane diol di(meth)acrylate) from Sartomer USA, LLC, Exton, Pa.).

Typically, the (meth)acrylate compound forms about 0 wt. % to about 25 wt. %, (in some embodiments, about 5 wt. % to about 25 wt. %, or about 10 wt. % to about 20 wt. %) of the polymer matrix composition. In some embodiments, if the (meth)acrylate polymer forms less than 5 wt. % of the organic polymer matrix composition, the (meth)acrylate compound does not adequately increase the viscosity of the resin composition used to form the organic polymer matrix to provide the thiol-alkene composition with a sufficient working time.

The components are generally used in approximately 1:1 molar amounts of thiol groups to alkene groups, +/−20%. Therefore, the molar ratio of thiol groups of the polythiol to alkene groups of the polyalkene will be from 1.2:1 to 1:1.2 (in some embodiments, 1.1:1 to 1:1.1). In embodiments where the thiol-alkene polymer composition further comprises an (meth)acrylate component, the molar functional group equivalent of alkene plus the molar functional group equivalent of (meth)acrylate is equal to the thiol equivalents +/−20%.

The thiol-alkene resin may be prepared, for example, by combining the polythiol and polyalkene in suitable ratios and then free-radically cured using a photo, thermal or redox initiator.

The thiol-alkene resin may be cured, for example, by exposure to actinic radiation (e.g., ultraviolet (UV) light). The composition may be exposed to any form of actinic radiation, (e.g., visible light or UV radiation), but is preferably exposed to UVA radiation (320 to 390 nm) or UVB radiation (395 to 445 nm). Generally, the amount of actinic radiation should be sufficient to form a solid mass that is not sticky to the touch. Generally, the amount of energy required for curing the compositions of the described herein ranges from about 0.2 J/cm$^2$ to 20.0 J/cm$^2$.

To initiate photopolymerization, the resin is placed under a source of actinic radiation such as a high-energy ultraviolet source having a duration and intensity of such exposure to provide for essentially complete (greater than 80%) polymerization of the composition contained in the molds. If desired, filters may be employed to exclude wavelengths that may deleteriously affect the reactive components or the photopolymerization. Photopolymerization may be affected via an exposed surface of the curable composition, or through the barrier layers as described herein by appropriate selection of a barrier film having the requisite transmission at the wavelengths necessary to effect polymerization.

Photoinitiation energy sources emit actinic radiation (i.e., radiation having a wavelength of 700 nanometers or less) which is capable of producing, either directly or indirectly, free radicals capable of initiating polymerization of the thiol-alkene compositions. In some embodiments, photoinitiation energy sources emit ultraviolet radiation (i.e., radiation having a wavelength between about 180 and about 460 nanometers) including photoinitiation energy sources such as mercury arc lights, carbon arc lights, low, medium, or high pressure mercury vapor lamps, swirl-flow plasma arc lamps, xenon flash lamps ultraviolet light emitting diodes, and ultraviolet light emitting lasers. Ultraviolet light emitting diodes available, for example, from Nichia Corp., Tokyo, Japan under the trade designations "NVSU233A U385," "NVSU233A U404," "NCSU276A U405," and "NCSU276A U385."

In one exemplary embodiment, the initiator is a photoinitiator and is capable of being activated by UV radiation. Exemplary photoinitiators include benzoin ethers (e.g., benzoin methyl ether and benzoin isopropyl ether, and substituted benzoin ethers), and substituted acetophenones (e.g., 2,2-dimethoxy-2-phenylacetophenone, and substituted alpha-ketols). Commercially available photoinitiators include those under the trade designations "IGACURE 819" and "DAROCUR 1173" from Ciba-Geigy Corp., Hawthorne, N.Y.; "LUCEM TPO" from BASF, Parsippany, N.J.; "IGACURE 651" (2,2-dimethoxy-1,2-diphenyl-1-ethanone) from Ciba-Geigy Corp. Exemplary photoinitiators include ethyl 2,4,6-trimethylbenzoylphenyl phosphinate (available, for example, under the trade designation "LUCIRIN TPO-L" from BASF, Florham Park, N.J.), 2-hydroxy-2-methyl-1-phenyl-propan-1-one (available, for example, under the trade designation "IRGACURE 1173" from Ciba Specialties, division of BASF, Florham, N.J.), 2,2-dimethoxy-2-phenyl acetophenone (available, for example, under the trade designation "IRGACURE 651" from Ciba Specialties), phenyl bis(2,4,6-trimethyl benzoyl)phosphine oxide (available, for example, under the trade designation "IRGACURE 819" from Ciba Specialties). Other exemplary photoinitiators include mercaptobenzothiazoles, mercaptobenzooxazoles and hexaryl bisimidazole.

Exemplary thermal initiators include peroxides (e.g., benzoyl peroxide, dibenzoyl peroxide, dilauryl peroxide, cyclohexane peroxide, methyl ethyl ketone peroxide), hydroperoxides (e.g., tert-butyl hydroperoxide and cumene hydroperoxide), dicyclohexyl peroxydicarbonate, 2,2'-azo-bis(isobutyronitrile), and t-butyl perbenzoate. Commercially available thermal initiators include those available under the trade designation "VAZO" (e.g., "VAZO 64" (2,2'-azo-bis (isobutyronitrile) and "VAZO 52" 2,2'-Azobis(2,4-dimethylvaleronitrile) from DuPont Specialty Chemical, Wilmington, Del.) and "LUCIDO 70" from Elf Atochem North America, Philadelphia, Pa.

The thiol-alkene resins may also be polymerized using a redox initiator system of an organic peroxide and a tertiary amine, as described in, for example, Bowman et al., Redox Initiation of Bulk Thiol-alkene Polymerizations, Polym. Chem., 2013, 4, 1167-1175, and references therein. Generally, the amount of initiator is less than 5 wt. % (in some embodiments, less than 2 wt. %). In some embodiments, there is no added free radical initiator.

If desired, a stabilizer or inhibitor may be added to the thiol-alkene composition to control the rate of reaction. The stabilizer can be any known in the art of thiol-alkene resins and include the N-nitroso compounds described in U.S. Pat.

No. 5,358,976 (Dowling et al.) and U.S. Pat. No. 5,208,281 (Glaser et al.), and the alkenyl substituted phenolic compounds described in U.S. Pat. No. 5,459,173 (Glaser et al.), the disclosures of which are incorporated herein by reference.

In some embodiments, the binder composition can be cured or hardened by heating. In other embodiments, the quantum dot composition may also be cured or hardened by applying radiation such as, for example, UV light. Curing or hardening steps may include UV curing, heating, or both. In some example embodiments that are not intended to be limiting, UV cure conditions can include applying about 10 mJ/cm$^2$ to about 4000 mJ/cm$^2$ of UVA (in some embodiments, about 10 mJ/cm$^2$ to about 200 mJ/cm$^2$ of UVA). Heating and UV light may also be applied alone or in combination to increase the viscosity of the binder composition, which can allow easier handling on coating and processing lines.

In some embodiments, the thiol-alkene formulation has viscosity range from 300 cP to 20,000 cP (in some embodiments, 500 cP to 15,000 cP, or even 1,000 cP to 5,000 cP) when the article is film.

The cured thiol-alkene polymer matrix has a transmissivity of at least 90% (in some embodiments, at least 95%) in the spectral region of incident radiation, typically region of 450±50 nm.

The cured thiol-alkene polymer matrix has $T_g$ at least 20° C.; preferably at least 30° C.

The thiol-alkene matrix has a transmissivity of at least 90% (in some embodiments, at least 95%) in the spectral region of incident radiation, typically region of 450±50 nm.

Contrary to the use of conventional matrices, the quantum efficiency of the dots in the thiol-alkene matrix often exceeds the efficiency of the quantum dots in solution. The quantum dot article can achieve an external quantum efficiency (EQE) >90% as measured using an integrating sphere apparatus (obtained under the trade designation "HAMAMATSU QUANTAURUS" from Hamamatsu Photonics K.K., Hamamatsu City, Japan), and accompanying software (obtained under the trade designation "U6039-05" from Hamamatsu Photonics K.K.).

Barrier Layers

The barrier layers can be formed of any useful material that can protect the quantum dots from exposure to environmental contaminates such as, for example, oxygen, water, and water vapor. Suitable barrier layers include, but are not limited to, films of polymers, glass, and dielectric materials. In some embodiments, suitable materials for the barrier layers include, for example, glass and polymers such as polyethylene terephthalate (PET), PEN, polethers, or PMMA; oxides such as silicon oxide, titanium oxide, or aluminum oxide (e.g., $SiO_2$, $Si_2O_3$, $TiO_2$, or $Al_2O_3$); and suitable combinations thereof. The barrier layers are desirable at least 90%, preferably at least 95%, transmissive to the selected wavelength of incident and emitted radiation.

More particularly, barrier films can be selected from a variety of constructions. Barrier films are typically selected such that they have oxygen and water transmission rates at a specified level as required by the application. In some embodiments, the barrier film has a water vapor transmission rate (WVTR) less than about 0.005 g/m$^2$/day at 38° C. and 100% relative humidity; in some embodiments, less than about 0.0005 g/m$^2$/day at 38° C. and 100% relative humidity; and in some embodiments, less than about 0.00005 g/m$^2$/day at 38° C. and 100% relative humidity. In some embodiments, the flexible barrier film has a WVTR of less than about 0.05, 0.005, 0.0005, or 0.00005 g/m$^2$/day at 50° C. and 100% relative humidity or even less than about 0.005, 0.0005, 0.00005 g/m$^2$/day at 85° C. and 100% relative humidity. In some embodiments, the barrier film has an oxygen transmission rate of less than about 0.005 g/m$^2$/day at 23° C. and 90% relative humidity; in some embodiments, less than about 0.0005 g/m$^2$/day at 23° C. and 90% relative humidity; and in some embodiments, less than about 0.00005 g/m$^2$/day at 23° C. and 90% relative humidity.

Exemplary useful barrier films include inorganic films prepared by atomic layer deposition, thermal evaporation, sputtering, and chemical vapor deposition. Useful barrier films are typically flexible and transparent. In some embodiments, useful barrier films comprise inorganic/organic. Flexible ultra-barrier films comprising inorganic/organic multi-layers are described, for example, in U.S. Pat. No. 7,018,713 (Padiyath et al.). Such flexible ultra-barrier films may have a first polymer layer disposed on polymeric film substrate that is overcoated with two or more inorganic barrier layers separated by at least one second polymer layer. In some embodiments, the barrier film comprises one inorganic barrier layer interposed between the first polymer layer disposed on the polymeric film substrate and a second polymer layer 224.

Optionally, the barrier films comprise one or more primer layers for further improved barrier performance as well as adhesion of quantum dots layer on barrier layers. However, with the thiol-alkene matrix, primer layers are not required.

In some embodiments, each barrier layer includes at least two sub-layers of different materials or compositions. In some embodiments, such a multi-layered barrier construction can more effectively reduce or eliminate pinhole defect alignment in the barrier layers providing a more effective shield against oxygen and moisture penetration into the organic matrix. Any suitable material or combination of barrier materials may be used and any suitable number of barrier layers or sub-layers on either or both sides of the quantum dot layer may be used. The materials, thickness, and number of barrier layers and sub-layers will depend on the particular application, and will suitably be chosen to maximize barrier protection and brightness of the quantum dots while minimizing the thickness of the quantum dot article.

In some embodiments each barrier layer is itself a laminate film, such as a dual laminate film, where each barrier film layer is sufficiently thick to eliminate wrinkling in roll-to-roll or laminate manufacturing processes. In one illustrative embodiment, the barrier layers are polyester films (e.g., PET) having an oxide layer on an exposed surface thereof.

Articles

Articles can be made comprising composite particles and a thiol-alkene matrix. Exemplary articles described herein can be made for use for display applications such as films (e.g., remote phosphor diffuser films for handheld devices, tablets, monitors, or televisions), LED caps, LED coatings, LED lenses, and light guides. In some embodiments, films comprising composite particles described herein are made. In some embodiments, a film further comprises a high barrier substrate film. Films can be made, for example, by coating a material onto a substrate and curing (polymerizing or crosslinking) the material.

Exemplary articles described herein can be made for use for nondisplay applications such as security applications where quantum dot phosphors are used to provide fluorescence at selected or tailored wavelengths. In such uses, the organic polymer matrix could be a label or a coating on a label, or other articles such as a card or tag.

Edge Ingress

With the thiol-alkene matrix, edge ingress of films of the present disclosure is observed to not exceed 0.5 mm after 100+ hours of accelerated aging. In some embodiments, the matrix limits the edge ingress after aging in 65° C. at 95% relative humidity or 85° C. conditions to less than 0.25 mm. These matrix formulations can extend the useful life of the quantum dot articles in display applications.

Ingress, including edge ingress, is defined by a loss in quantum dot performance (degraded or dead which is dark since no more emitting light under blue light) due to ingress of moisture and/or oxygen into the matrix. In various embodiments, the edge ingress of moisture and oxygen into the cured matrix is less than 1.0 mm after 1 week at 85° C. (in some embodiments, less than 0.75 mm after 1 week at 85° C., less than 0.5 mm after 1 week at 85° C. or even less than 0.25 mm after 1 week at 85° C.). In various embodiments the matrix has a moisture and oxygen ingress of less than about 0.5 mm after 500 hours at 65° C. and 95% relative humidity.

In various embodiments, oxygen permeation into the cured matrix is less than about 50 cc/(m$^2$/day (in some embodiments, less than about 25 cc/m$^2$/day or less than about 10 cc/m$^2$/day). In some embodiments, the water vapor transmission rate of the cured matrix is less than 15 g/m$^2$·mil·day or even less than about 10 g/m$^2$·mil·day.

Color Change

In some embodiments, the color change of an article of the disclosure observed upon aging is defined by a change of less than 0.02 on the CIE 1931 (x,y) chromaticity coordinate system following an aging period of 1 week at 85° C. In some embodiments, the color change of an article of the disclosure upon aging is less than 0.005 on the following an aging period of 1 week at 85° C. In some embodiments, an article of the disclosure has a color shift d(x,y) using the CIE 1931 (x,y) convention of less than about 0.02 after 100 hours at 65° C. and 95% relative humidity.

EXEMPLARY EMBODIMENTS

Embodiment 1 of the present disclosure provides a curable composition comprising: at least one polythiol; at least one polyalkene; and composite particles, wherein the composite particles comprise: a hydrophobic nonmetallic inorganic matrix; quantum dots; and ligands; wherein the nonmetallic inorganic matrix is present in the composite particles in an amount of up to 40 volume percent.

Embodiment 2 is the curable composition of embodiment 1 wherein the quantum dots comprise up to 50% by weight of quantum dots and the ligands.

Embodiment 3 is the curable composition of embodiment 1 or 2 comprising no more than 20% by weight of the composite particles, based on the total weight of the curable composition.

Embodiment 4 is the curable composition of any of embodiments 1 through 3 further comprising a curing initiator for the ployhiol and polyalkene.

Embodiment 5 is the curable composition of any of embodiments 1 through 4 wherein the ligands comprise an amine-functionalized liquid polysiloxane having a viscosity of less than 10,000 cP.

Embodiment 6 is the curable composition of any of embodiments 1 through 5 wherein the inorganic core-shell quantum dots comprises a CdSe core and ZnS shell.

Embodiment 7 is the curable composition of any of embodiments 1 through 6 wherein the polythiol comprises tris[2-(3-mercaptopropionyloxy)ethyl] isocyanurate.

Embodiment 8 is the curable composition of any of embodiments 1 through 7 wherein the polyalkene comprises triallyl isocyanurate, triallyl cyanurate, or a corresponding oligomeric polyalkene derived from triallyl isocyanurate and triallyl cyanurate.

Embodiment 9 is the curable composition of any of embodiments 1 through 8 wherein the hydrophobic nonmetallic inorganic matrix comprises a hydrophobic organic coating on the inorganic nonmetallic matrix of the porous particles.

Embodiment 10 is the curable composition of embodiment 9 wherein the hydrophobic nonmetallic inorganic matrix comprises a Me$_3$Si-modified surface.

Embodiment 11 is the curable composition of embodiment 9 wherein the hydrophobic nonmetallic inorganic matrix comprises aerogel silica particles.

Embodiment 12 is an article comprising a cured composition of any of embodiments 1 through 11 wherein the composite particles are dispersed in a cured thiol-alkene matrix derived from the polythiol and the polyalkene, wherein the thiol-alkene matrix has a Tg of at least 20° C.

Embodiment 13 is the article of embodiment 12 further comprising a covering barrier film.

Embodiment 14 is the article of embodiment 13 wherein the cured composition forms a layer between two barrier films.

Embodiment 15 is an article comprising composite particles in an organic polymer matrix comprising a cured thiol-alkene resin having a T$_g$ greater than 20° C., the composite particles comprising a hydrophobic nonmetallic inorganic matrix, ligands, and quantum dots, wherein the hydrophobic nonmetallic inorganic matrix is present in the composite particles in an amount of up to 40 volume percent.

Embodiment 16 is the article of embodiment 15 further comprising a covering barrier film.

Embodiment 17 is the article of embodiment 16 wherein the composite particles in an organic polymer matrix forms a layer between two barrier films.

Embodiment 18 is the article of embodiment any of embodiments 15 through 17 wherein the nonmetallic inorganic matrix comprises at least one of silica or metal oxide.

Embodiment 19 is the article of any of embodiments 15 through 18 wherein at least 60 volume percent of the composite particles is collectively the ligands and the quantum dots.

Embodiment 20 is the article of any of embodiments 15 through 19 wherein the hydrophobic nonmetallic inorganic matrix comprises at least one of silica or metal oxide, wherein the surface is modified with hydrophobic organic group.

Embodiment 21 is the article of any of embodiments 15 through 20 wherein the hydrophobic nonmetallic inorganic matrix comprises aerogel particles modified with hydrophobic Me$_3$Si-groups.

Embodiment 22 is the article of any of embodiments 15 through 20 wherein the hydrophobic nonmetallic inorganic matrix comprises chromatography media modified with hydrophobic Me$_3$Si-groups.

Embodiment 23 is the article of any of embodiments 15 through 22 wherein the ligands include at least one of an aminosilicone or a carboxylic acid functional polymer.

Embodiment 24 is the article of any of embodiments 15 through 23 wherein the quantum dots comprise CdSe or InP nanoparticles.

Embodiment 25 is the article of any of embodiments 15 through 24 wherein the cured thiol-alkene resin is the reaction product of at least one polythiol and at least one polyalkene, wherein the functionality of both the polythiol and the polyalkene is at least 2.

Embodiment 26 is the article of embodiment 25 wherein the polyalkene is at least one of terminal polyalkene, poly (vinyl ether), poly(allyl ether), or poly(allyl amine).

Embodiment 27 is the article of any of embodiments 15 through 26 which has an edge ingress less than 0.25 mm after aging at 85° C. for 7 days.

EXAMPLES

Objects and advantages of this invention are further illustrated by the following examples, but the particular materials and amounts thereof recited in these examples, as well as other conditions and details, should not be construed to unduly limit this invention. These examples are merely for illustrative purposes only and are not meant to be limiting on the scope of the appended claims. Unless otherwise noted, amounts of material are listed by weight, or by weight percent ("wt-%").

Materials

| Designation | Description |
|---|---|
| QD | Green CdSe quantum dots stabilized with amine-functionalized silicone from Nanosys, Inc., Milpitas, California (Lot # QCG 052214-24; OD = 34.1; QY = 94%) |
| Toluene | Anhydrous, from Aldrich Chemical Co., Milwaukee, Wisconsin |
| Ethanol | Anhydrous, from Aldrich Chemical Co., Milwaukee, Wisconsin |
| A-SiO$_2$ | Hydrophobic aerogel Silica (particles size, 2-40 micrometers; pore diameter, approximately 20 nm), from Cabot Aerogel, Alpharetta, Georgia under trade designation "ENOVA AEROGEL IC3100" |
| CG-SiO$_2$ | Hydrophilic chromatographic silica (particles size, 16-24 micrometers; pore size, approximately 1000 angstrom) obtained from Chromatographic Specialties Inc., Brockville, Ontario, Canada under trade designation "DAVISIL MVP1000A" |
| TEMPIC | Tris[2-(3-mercaptopropionyloxy)ethyl]isocyanurate, from Bruno Bock Chemische Fabrik GmbH & Co. KG, Marschacht, Germany [CAS # 36196-44-8, MW = 525.62 (EW = 175.206)] 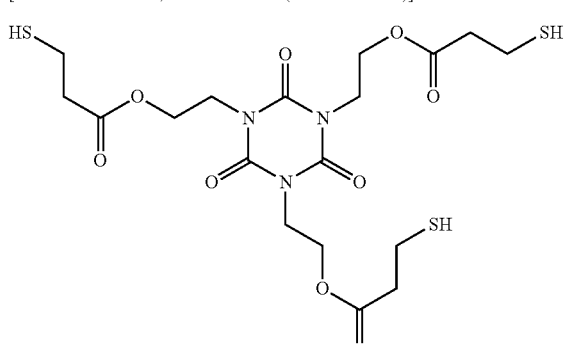 |
| TAIC | Triallyl Isocyanurate, from TCI America, Portland, Oregon [CAS # 1025-15-6, MW = 249.271] 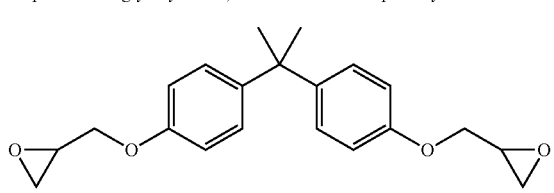 |
| TPO-L | Ethyl-2,4,6-trimethylbenzoylphenylphosphinate, is a liquid UV initiator, from BASF Corporation, Florham Park, New Jersey under trade designation "LUCIRIN TPO-L" |
| EPON 828 | Bisphenol A diglycidyl ether, from Momentive Specialty Chemicals Inc., Columbus, Ohio under trade designation "EPON 828" |
| SR 348 | Bisphenol A dimethacrylate, from Sartomer Arkema, Exton, Pennsylvania under trade designation "SR 348" 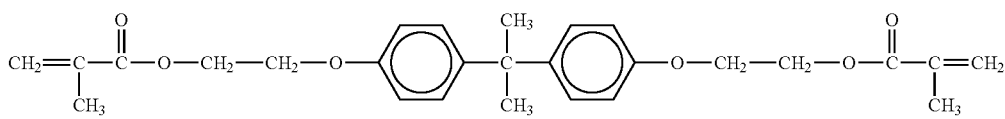 |

| Designation | Description |
|---|---|
| DAROCURE 4265 | A highly efficient liquid pho omitiator blend of acyl phosphine oxide/alpha hydroxy ketone, from BASF Corporation, Florham Park, New Jersey under trade designation "DAROCURE 4265" |
| TTD-Diamine | 4,7,9-trioxatridecane-1,13-diamine, $(NH_2(CH_2)_3O(CH_2)_2O(CH_2)_2O(CH_2)_3NH_2)$, from BASF Corporation, Florham Park, New Jersey |

Quantum Dot Composite Particles (QDCP)

To prepare QDCP based on A-SiO$_2$ (referred to hereinafter as QD/A-SiO$_2$), 15 grams of QD was mixed with 40 grams of toluene in a glass jar in a nitrogen box to prepare a QD solution. This QD solution was slowly added to another glass flask containing 10 grams of A-SiO$_2$, fully mixed and then the solvent was removed under vacuum at room temperature (RT). The resulting solid mix was further vacuum dried at RT for two days, ground and then sieved to retain 75 micrometer or finer particles.

QDCP based on GC-SiO$_2$ (referred to hereinafter as QD/CG-SiO$_2$) were prepared in the same manner as QD/A-SiO$_2$, except that the QD solution was prepared by mixing 15 grams of QD in 20 grams of ethanol and then adding the this QD solution into another glass flask containing 13.5 grams of CG-SiO$_2$ drop-by-drop in a nitrogen box.

Thiol-Ene (TE) Matrix

TE matrix was prepared by mixing 13.6 grams of TEMPIC, 6.45 grams of TAIC and 0.2 gram of TPO-L.

G-1 Matrix

One hundred grams (100 grams) of G-1 matrix was freshly prepared by mixing 70.06 grams of Part A and 29.94 grams of Part B before use. Part A contained 55.60 grams of EPON 828, 13.94 grams of SR 348 and 0.52 gram of DAROCURE 4265. Part B was prepared by pre-reacting TTD-Diamine with EPON 828 in a mole ratio of 3:1, to form a mixture of TTD-Diamine and the extended diamine (shown below) at 1:1 mole ratio.

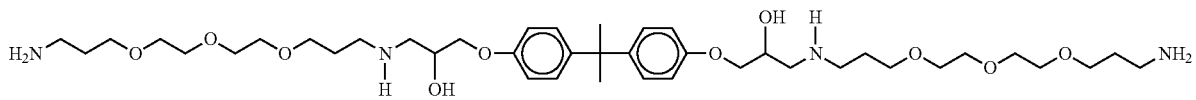

Example 1 (EX1)

In a nitrogen box, 2.38 grams of TE matrix, prepared as described above, and 0.3 gram of QD/A-SiO$_2$, prepared as described above, were fully mixed in a vial. Then, the mixture was knife-coated between two barrier films at the thickness of ~100 micrometers and cured by exposing the coated film under 385 nm LED UV light (from Clearstone Tech CF200 100-240V 6.0-3.5 A 50-60 Hz) for 30 seconds at 50% power. The barrier film used for coating was 2-mil (50 micrometer) thick, primed PET barrier films (FTB3-M-50, available from 3M Company, St. Paul, Minn. under trade designation "3M FTB3 BARRIER FILM").

Comparative Examples A-E (CEA-CEE)

To prepare CEA, in a nitrogen box, 2.38 grams of G-1 matrix, prepared as described above, and 0.3 gram of QD/A-SiO$_2$, prepared as described above, were fully mixed in a vial. Then, the mixture was knife-coated between two barrier films at the thickness of ~100 micrometers and cured by exposing the coated film under 385 nm LED UV light (from Clearstone Tech CF200 100-240V 6.0-3.5 A 50-60 Hz) for 30 seconds at 50% power. The barrier film used for coating was 2-mil (50 micrometer) thick, primed PET barrier films (FTB3-M-50, available from 3M Company, St. Paul, Minn. under trade designation "3M FTB3 BARRIER FILM"). The resulting film was further cured in a 100° C. oven for 10 minutes.

CEB and CEC were prepared in the same manner as EX1 and CEA, respectively, except that the QDCP was CG-SiO$_2$.

CED was prepared by fully mixing 20 grams of TE matrix, prepared as described above, and 1 gram of using a Cowles blade mixer at the speed of 1400 rpm for 2 minutes in a nitrogen box. Then, the mixture was knife-coated between two barrier films at the thickness of ~100 micrometers and cured as described above in EX1.

CEE was prepared in the same manner as CED except that the matrix was G-1, and the knife-coated films were cured as described above in CEA.

The EX1 and CEA-CEE films were used for quantum yield measurements both as prepared (i.e., initial EQE and Abs %) and after subjecting them to an aging stability them in an 85° C. oven for 7 days (i.e., aged EQE and EI). All quantum yields (i.e., external quantum efficiency and (EQE) and % Absorption (% Abs) were measured by using an absolute PL Quantum Yield Spectrometer C11347 (Hamamatsu Corporation, Middlesex, N.J.)). Edge ingress was determined by placing the coatings on a black light and then measuring how much of the edge of the film is dark (does not illuminate) with a ruler.

Table 1, below summarizes the results of initial and aged EQE data for EX1 and CEA-CEE.

TABLE 1

| | | | Initial | | After Aging | |
|---|---|---|---|---|---|---|
| | Description | | EQE | Abs | EQE | EI |
| Example | QD/QDCP | Matrix | % | % | % | (mm) |
| EX1 | QD/A-SiO$_2$ | TE | 99 | 49 | 96 | <0.1 |
| CEA | QD/A-SiO$_2$ | G-1 | 87 | 52 | N/A | ~1 |
| CEB | QD/CG-SiO$_2$ | TE | 95 | 41 | 69 | 0.25 |
| CEC | QD/CG-SiO$_2$ | G-1 | 87 | 41 | N/A | 1.25 |
| CED | QD | TE | 95 | 29 | 90 | <0.25 |
| CEE | QD | G-1 | 84 | 32 | 70 | 1 |

EX1 films were subjected to a lifetime stability study. Coatings were tested after 500 hours of aging at 85° C. (aged at a temperature of 85° C.) and a light intensity of 152 watts/sr/m² (1×). The results after 500 hours are summarized in Table 2, below.

TABLE 2

| Aging Conditions | Luminance Retention (before aging = 100%) | Color Retention, Change (x, y) | Edge Ingress (mm) |
|---|---|---|---|
| 85° C. | 105% | 0.009 | 0.1 |
| 1X Light | 106% | 0.009 | 0.0 |

The complete disclosures of the patents, patent documents, and publications cited herein are incorporated by reference in their entirety as if each were individually incorporated. Various modifications and alterations to this disclosure will become apparent to those skilled in the art without departing from the scope and spirit of this disclosure. It should be understood that this disclosure is not intended to be unduly limited by the illustrative embodiments and examples set forth herein and that such examples and embodiments are presented by way of example only with the scope of the disclosure intended to be limited only by the claims set forth herein as follows.

What is claimed is:

1. A curable composition comprising:
   at least one polythiol, wherein the polythiol has a functionality of 3 and has an isocyanurate group;
   at least one polyalkene, wherein the polyalkene comprises triallyl isocyanurate, triallyl cyanurate, or a corresponding oligomeric polyalkene derived from triallyl isocyanurate and triallyl cyanurate; and
   unencapsulated composite particles comprising:
   a hydrophobic nonmetallic inorganic matrix comprising at least one of silica or metal oxide;
   quantum dots comprising a CdSe or InP core and ZnS shell; and
   ligands, wherein the ligands include at least one of an aminosilicone or a carboxylic acid functional polymer;
   wherein the hydrophobic nonmetallic inorganic matrix is present in the composite particles in an amount of 5 to 40 volume percent.

2. The curable composition of claim 1 comprising no more than 20% by weight of the composite particles, based on the total weight of the curable composition.

3. The curable composition of claim 1 wherein the ligands comprise an amine-functionalized liquid polysiloxane having a viscosity of less than 10,000 cP.

4. The curable composition of claim 1 wherein the quantum dots comprises a CdSe core and ZnS shell.

5. The curable composition of claim 1 wherein the hydrophobic nonmetallic inorganic matrix comprises a hydrophobic organic coating on the inorganic nonmetallic matrix of the composite particles.

6. An article comprising a cured composition of claim 1 wherein the composite particles are dispersed in a cured thiol-alkene matrix derived from the polythiol and the polyalkene, wherein the thiol-alkene matrix has a Tg of at least 20° C.

7. An article comprising unencapsulated composite particles in an organic polymer matrix comprising a cured thiol-alkene resin having a Tg greater than 20° C., the composite particles comprising a hydrophobic nonmetallic inorganic matrix comprising at least one of silica or metal oxide, ligands, wherein the ligands include at least one of an aminosilicone or a carboxylic acid functional polymer, and quantum dots comprising a CdSe or InP core and ZnS shell, wherein the hydrophobic nonmetallic inorganic matrix is present in the composite particles in an amount of 5 to 40 volume percent; wherein the cured thiol-alkene resin is the reaction product of at least one polythiol and at least one polyalkene, wherein the polyalkene comprises triallyl isocyanurate, triallyl cyanurate, or a corresponding oligomeric polyalkene derived from triallyl isocyanurate and triallyl cyanurate, and the polythiol has a functionality of 3 and has an isocyanurate group.

8. The article of claim 7 further comprising a covering barrier film.

9. The article of claim 8 wherein the composite particles in the organic polymer matrix forms a layer between the covering barrier film and a second barrier film.

10. The article of claim 7 wherein the surface of the silica or metal oxide is modified with hydrophobic organic group.

11. The article of claim 7 wherein the article has an edge ingress less than 0.25 mm after aging at 85° C. for 7 days.

* * * * *